(12) United States Patent
Moriguchi et al.

(10) Patent No.: US 6,282,913 B1
(45) Date of Patent: Sep. 4, 2001

(54) WATER VAPORIZATION TYPE COOLING APPARATUS FOR HEAT-GENERATING UNIT

(75) Inventors: Tetsuo Moriguchi; Kazuhiko Hara, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/442,464

(22) Filed: Nov. 18, 1999

(30) Foreign Application Priority Data

Jun. 11, 1999 (JP) .................................................. 11-165367

(51) Int. Cl.⁷ ...................................................... F25D 23/12
(52) U.S. Cl. ............................... 62/259.2; 62/305; 62/315
(58) Field of Search ................................ 62/259.2, 305, 62/315, 316

(56) References Cited

U.S. PATENT DOCUMENTS

| | | | |
|---|---|---|---|
| 5,184,470 | * 2/1993 | Moser et al. | 62/4 |
| 5,687,576 | 11/1997 | Moriguchi et al. | 62/56 |
| 5,704,416 | 1/1998 | Larson et al. | |
| 5,946,931 | 9/1999 | Lomax et al. | |
| 6,069,791 | * 5/2000 | Goto et al. | 361/687 |
| 6,166,907 | * 12/2000 | Chien | 361/699 |

FOREIGN PATENT DOCUMENTS

| | | | |
|---|---|---|---|
| 2 314 920 | 1/1998 | (GB) . | |
| 0304521 | 2/1991 | (JP) . | |
| 6-21279 | 1/1994 | (JP) | H01L/23/36 |
| 11-54973 | 2/1999 | (JP) | H05K/7/20 |

* cited by examiner

Primary Examiner—William Doerrler
Assistant Examiner—Melvin Jones
(74) Attorney, Agent, or Firm—Sughrue, Mion, Zinn, Macpeak & Seas, PLLC

(57) ABSTRACT

A water vaporization type cooling apparatus for cooling a heat-generating unit comprises a container which is made of a good thermal conductive material and has an opening, a selective water vapor permeable membrane which is mounted to the container so as to cover the opening and forms a closed space cooperatively with the container, and water charged in the closed space. In the water vaporization type cooling apparatus, the container is thermally connected to the heat-generating unit and dehydrated air flows along the outer surface of the selective water vapor permeable membrane, whereby the heat-generating unit is cooled down.

4 Claims, 8 Drawing Sheets

FIG. 3

| | GAS PERMEATION RATE (Nm³/m²·hr·atm) | RATIOS OF PERMEATION RATES ($Q_{H_2O}/Q_{GAS}$) |
|---|---|---|
| WATER VAPOR | 83 | |
| $N_2$ | $3.3 \times 10^{-4}$ | $252 \times 10^{+3}$ |
| $O_2$ | $3.5 \times 10^{-4}$ | $143 \times 10^{+3}$ |
| $H_2$ | $3.0 \times 10^{-3}$ | $28 \times 10^{+3}$ |
| $CH_4$ | $3.1 \times 10^{-4}$ | $268 \times 10^{+3}$ |

# WATER VAPORIZATION TYPE COOLING APPARATUS FOR HEAT-GENERATING UNIT

BACKGROUND OF THE INVENTION

1. Field of the Invention

The present invention relates to a cooling apparatus for a computer storage unit or an electronic board mounting an LSI and other electronic devices to be mounted on an electronic equipment or an electrical power equipment. More particularly, the invention relates to a compact water vaporization type cooling apparatus excellent in cooling property, which permits inhibition of a temperature increase by eliminating heat generation from electronic parts or a computer storage unit, and ensures normal operation even in an environment of a temperature over the maximum working temperature of an electronic equipment.

2. Description of the Related Art

For the purpose of cooling electronic parts including LSI mounted on an electronic equipment or an electrical power equipment, it has been the conventional practice to dissipate the heat generated from heating members such as an LSI through combination of a refrigerant bag and a heat pipe, as disclosed, for example, in Japanese Unexamined Patent Publication No. 6-21,279.

FIG. 8 is a configuration diagram illustrating a conventional heat transfer apparatus, for example, disclosed in Japanese Unexamined Patent Publication No. 6-21,279.

In the drawing, a protective metallic container 1 has an opening 2 provided in the bottom thereof. A refrigerant bag 3 is housed in the lower part of the protective metallic container 1. The refrigerant bag 3 has a configuration in which the both ends of a cylinder made of a soft plastic material such as polyethylene are sealed by heat sealing, and filled with an operating liquid 4, with the upper space filled with a gas. When this refrigerant bag 3 is housed in the protective metallic container 1, a part of the refrigerant bag 3 projects from the opening 2, and there is formed a contact portion 5 coming into contact with an object 8 of cooling such as the LSI.

Further, a heat transfer pipe 6 is housed in the protective metallic container 1 as if it were wrapped by the refrigerant bag 3. A radiator fin 7 is attached to an end of the heat transfer pipe 6 projecting outside from the protective metallic container 1.

Applicable operating liquids 4 include halogen-based solvents such as flon and p-fluorocarbon ($C_6F_4$).

Operations of the conventional heat transfer apparatus will now be described.

The heat transfer apparatus is installed so that the contact portion 5 comes into contact with the object 8 of cooling such as an LSI. Heat generated by the object 8 of cooling is transferred from the contact portion 5 to the operating liquid 4. The operating liquid 4 is evaporated by the heat transferred from the contact portion 5. The thus generated vapor rises up through the upper space of the refrigerant bag 3, and upon reaching the portion in contact with the heat transfer pipe 6, the heat is absorbed by the heat transfer pipe 6 there, the condensed vapor being liquefied and dropping. Through this exchange of latent heat, the heat is absorbed by the heat transfer pipe 6. Then, the heat is dissipated from the radiator fin 7 provided at an end of the heat transfer pipe 6. By repeating this process of heat exchange, the object 8 of cooling is cooled.

In the conventional heat transfer apparatus having the configuration as described above, the object 8 of cooling cannot be cooled beyond the outer periphery temperature of the radiating section, and therefore, the apparatus cannot be operated in an environment including a temperature of over the maximum working temperature of the electronic equipment. There is therefore a problem of limited environments of use.

Since a halogen-based solvent such as flon or perfluorocarbon is used as the operating liquid 4, the refrigerant must be collected upon abolishing the apparatus for environmental protection purposes. However, many of electronic equipments are supplied to a market composed of unspecified users, and this has posed the problem of establishing a method of collection.

In general, an electronic equipment should meet the requirement for downsizing. The aforementioned structure of the heat transfer apparatus however comprises many components near the board, and this has prevented the problem of downsizing from being solved.

The object 8 of cooling is in mechanical contact with the refrigerant bag 3. This results in a large contact heat resistance, leading to a further larger heat density. As a result, there is posed another problem of impossibility to take sufficient actions to satisfy the requirement for a cooling method excellent in cooling performance.

SUMMARY OF THE INVENTION

The present invention was developed to solve the aforementioned problems and has an object to provide a compact water vaporization type cooling apparatus of a heating element, which permits cooling of the heating element to a temperature lower than the outer periphery temperature of the heat-generating unit, without limitation of the working environment, and is suitable for environmental protection purposes.

In order to achieve the above object, according to one aspect of the present invention, there is provided a water vaporization type cooling apparatus for cooling a heat-generating unit, comprising a container which is made of a good thermal conductive material and has an opening; a selective water vapor permeable membrane which is mounted to the container so as to cover the opening and forms a closed space cooperatively with the container; and water charged in the closed space. In the water evaporative cooling device, the container is thermally connected to the heat-generating unit and dehydrated air flows along the outer surface of the selective water vapor permeable membrane, whereby the heat-generating unit is cooled down.

BRIEF DESCRIPTION OF THE DRAWINGS

FIG. 3 is a table of gas permeation rate and a ratio thereof through a selective water vapor permeable membrane applied to the water vaporization type cooling apparatus according to the first embodiment of the present invention for the heat-generating unit;

DESCRIPTION OF THE PREFERRED EMBODIMENTS

Figure 1:
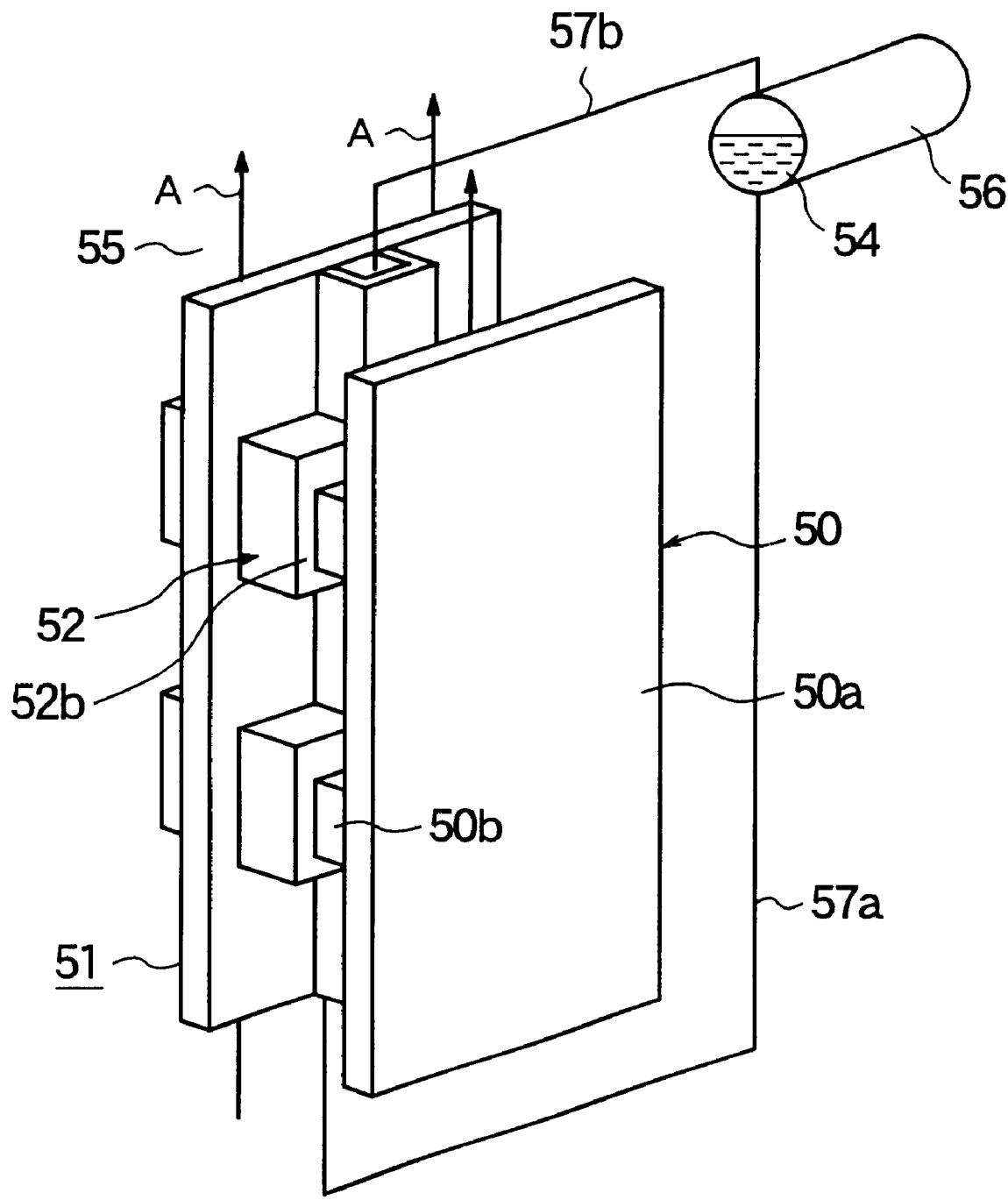
FIG. 1 shows a system arrangement of a water vaporization type cooling apparatus according to a first embodiment of the present invention for a heat generating unit.
Figure 2:
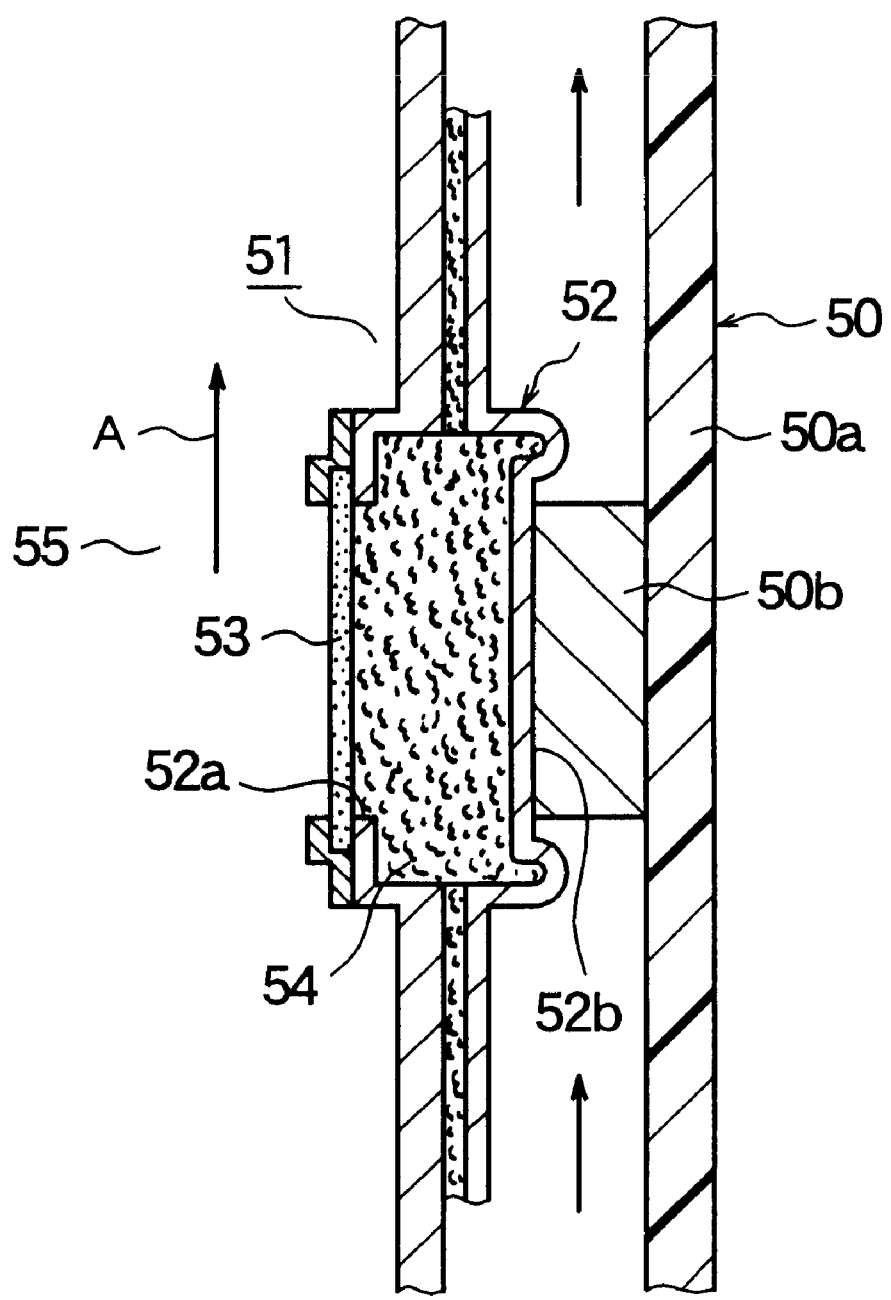
FIG. 2 is a sectional view of a major portion of the water vaporization type cooling apparatus according to the first embodiment of the present invention for the heat-generating unit.

Embodiments according to the present invention will be explained with reference to the accompanying drawings.
First Embodiment FIG. 1 shows a system arrangement of a water vaporization type cooling apparatus according to the first embodiment of the present invention for a heat-generating unit. FIG. 2 is a sectional view of a major portion of the water vaporization type cooling apparatus according to the first embodiment of the present invention for the heat-generating unit.

In FIGS. 1 and 2, the heat-generating unit 50 is composed of electronic parts, such as a CPU 50b used for a computer, mounted on a board 50a. A heat sink 51 is composed of a container 52 made of a good thermal conductive material and a selective water vapor permeable membrane 53 mounted to the container 52 so as to cover an opening 52a provided at a part of the container 52, wherein a space formed by the container 52 and the selective water vapor permeable membrane 53 is filled with water 54.

A wall 52b of the container 52 opposing the selective water vapor permeable membrane 53 is thermally connected to the heat-generating unit 50 tightly by a good thermal conductive adhesive agent. On the outer surface of the selective water vapor permeable membrane 53, dehydrated air 55 flows in a direction shown by an arrow A. The heat sink 51 is connected to a water supply tank 56 through conduits 57a and 57b, and the water 54 is to be fed continuously into the heat sink 51.

The term "good thermal conductive material" means a material having high thermal conductivity; metal such as copper, silver, gold, and aluminum are used for this purpose.

Next, an operation of the water vaporization type cooling apparatus according to the first embodiment will be explained.

Heat generated by the heat-generating unit 50 flows into the heat sink 51 thermally connected to the heat-generating unit 50, so that the water 54 in the heat sink 51 is heated. Consequently, water vapor evolves at the interface between the water 54 and the selective water vapor permeable membrane 53, and afterwards the water vapor passing through the selective water vapor permeable membrane 53 is absorbed in the dehydrated air 55 flowing along the outer surface of the selective water vapor permeable membrane 53.

Hence, the heat generated by the heat-generating unit 50 is absorbed in the dehydrated air 55, that is, the heat-generating unit 50 is cooled down.

Now, the selective water vapor permeable membrane 53 used for the embodiment of the present invention will be explained.

The selective water vapor permeable membrane 53 has a function that a permeation rate of water vapor is markedly larger than that of the components of air. A functional membrane composed of a fluorinated resin, having a hydrophilic functional group, laminated with or impregnated into a porous carrier, as described in Japanese Unexamined Patent Application Publication No. 1-194927, can be used as the selective water vapor permeable membrane 53.

Since the functional membrane made of the porous carrier laminated or impregnated with the fluorinated resin becomes non-porous material at least in a thickness direction thereof, air, nitrogen, and hydrocarbons such as methane are substantially not allowed to permeate through the membrane 53. On the other hand, the water vapor absorbs on the surface of the membrane made of the fluorinated resin by means of the hydrophilic functional group thereof, diffuses in the layer of the fluorinated resin, and rapidly permeates through the membrane 53. Driving force by which the water vapor permeates is a difference of partial pressure of the water vapor across the membrane. The larger the difference of the partial pressure is, the greater the permeation rate of the water vapor is.

A cellulose, a polyolefin, a polyester, a polysulfone, and a fluorinated type porous sheets, nonwoven fabric, and woven fabric can be used as the porous carrier. Of those listed above, the fluorinated type resin associated with heat stability and chemical resistance is preferable.

The hydrophilic functional group connected to the fluorinated resin includes a sulfonic, a sulfonic salt, a sulfate, a sulfate salt, a carboxyl, and/or a carboxyl salt groups.

The selective water vapor permeable membrane 53 utilized in the first embodiment is prepared by processes as described below. Ten micrometer thickness of the fluorinated polymer having the sulfate salt group is formed on a porous membrane (thickness: 40 micrometer, porosity: 75%, the maximum pore diameter: 0.5 micrometer) made of a drawn membrane of a polytetrafluoroethylene, and after air-drying the membrane is dried at 100° C. for 180 minutes. In FIG. 3, gas permeation rate of water vapor, oxygen, nitrogen, hydrogen, and methane by use of the selective water vapor permeable membrane 53 prepared as described above, and the ratios of the permeation rate are shown. It is appreciated from FIG. 3 that oxygen and nitrogen, i.e., components of the air, scarcely permeate, and water vapor selectively permeates through the membrane 53.

Figure 4:
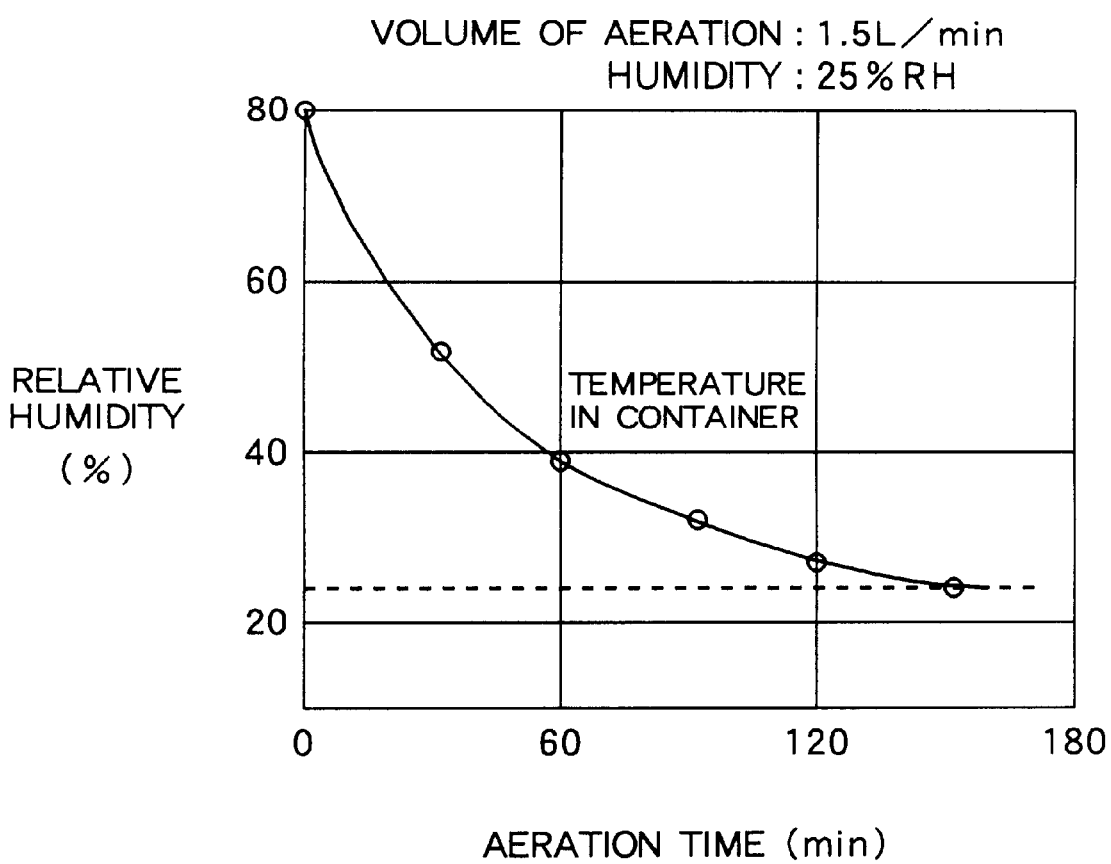
FIG. 4 is a graph explaining a function of the selective water vapor permeable membrane applied to the water vaporization type cooling apparatus according to the first embodiment of the present invention for the heat-generating unit.

For confirming the function of the selective water vapor permeable membrane 53, a measurement instrument is prepared, wherein the instrument is composed of a closed container of 15 liter volume having an opening of 50 cm$^2$ area on the wall of the container and the selective water vapor permeable membrane 53 mounted to the container so as to cover the opening. The measurement result of humidity in the closed container with humidified condition therein, when dehydrated air of 20° C. flows along the outer surface of the selective water vapor permeable membrane 53, is shown in FIG. 4. It is understood from FIG. 4 that the water vapor is drawn from the closed container by the dehydrated air flowing along the outer surface of the selective water vapor permeable membrane 53, so that the humidity therein becomes lower. It is also appreciated that, by the dehydrated air flowing along the outer surface of the selective water vapor permeable membrane 53 for a predetermined period of time, the humidity in the closed container can be reduced to the level of the dehydrated air.

The principle, in which the water can be cooled down below the temperature of the air by contacting the dehydrated air with the water, is now explained.

Figure 5:
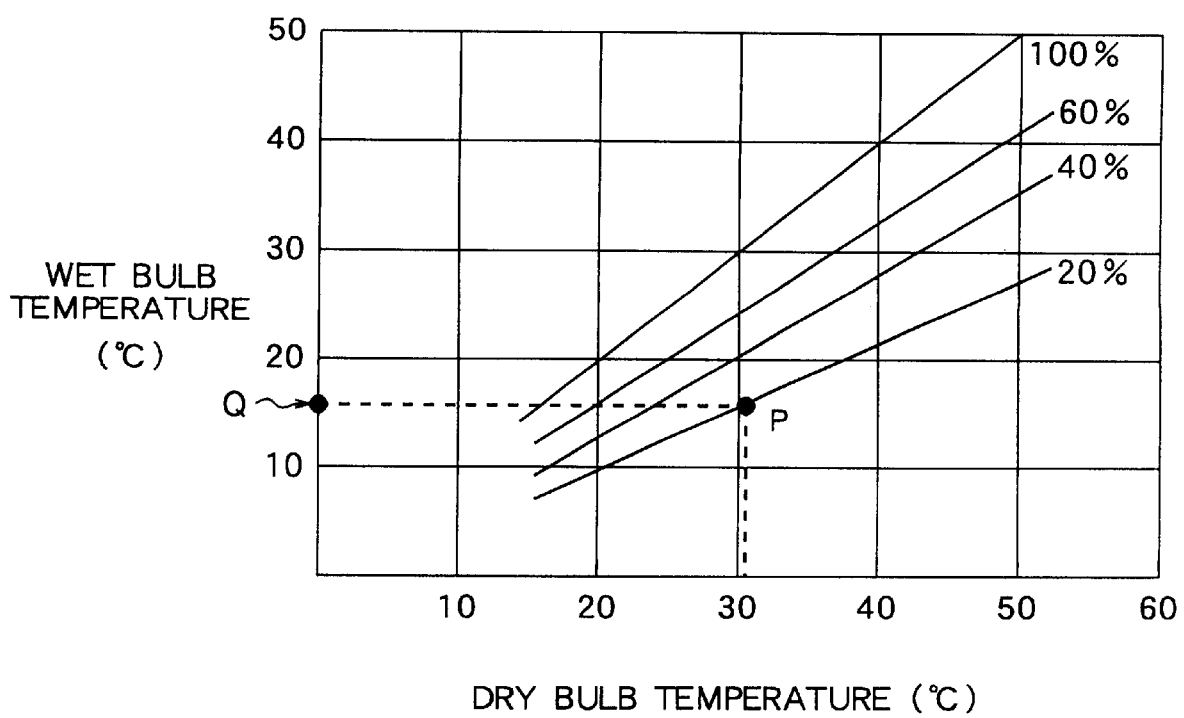
FIG. 5 is a graph explaining a cooling principle of the water vaporization type cooling apparatus according to the present invention for the heat-generating unit.

When the temperature and the humidity of the dehydrated air are 32° C. and 20 percent respectively (corresponding to the point P in FIG. 5) as shown in a graph of FIG. 5, the temperature of the water contacting with this air isoenthalpically varies along the straight line between P and Q and decreases to the wet-bulb temperature (TW) of 17° C. (corresponding to the point Q in FIG. 5). This is caused by the fact that the water evaporated is absorbed in the dehydrated air, thus the temperature decreases as a result of the deprivation of the evaporation latent heat when the water evaporates. The water is cooled down according to the principle explained above and absorbs the heat from the CPU 50b of the heat-generating unit 50, so that the CPU 50b is cooled down. Hence, even when the heat-generating unit 50 is disposed in higher temperature condition, the temperature of the heat sink 51 can be maintained less than that in the condition. That means, if necessary, the CPU 50b can be cooled down below the ambient temperature.

The cooling according to the first embodiment utilizes the evaporation latent heat of the water instead of the sensible heat of air. Therefore, a small amount of circulating water gives a high cooling effect since the water has the large evaporation latent heat of 590 Kcal/kg. Moreover, since the circulation of the air acts only as a medium for transporting the water vapor evolved through the water evaporation, volume of air to be circulated is extremely small comparing with a wind cooling which utilizes the sensible heat of the air with the specific heat of 0.24 Kcal/kg.° C. Accordingly, no large air passage for the aeration is required, so that the arrangement of the cooling apparatus can be miniaturized.

In the first embodiment as explained above, the selective water vapor permeable membrane 53 is mounted to the container 52 so as to cover the opening 52a provided at the part of the wall of the container 52 composing the heat sink 51, and the wall 52b of the container 52, opposing the selective water vapor permeable membrane 53, is thermally connected to the heat-generating unit 50. The water evaporates at the interface between the selective water vapor permeable membrane 53 and the water by the dehydrated air 55 flowing along the outer surface of the selective water vapor permeable membrane 53, thus the temperature decreases as a result of the deprivation of the evaporation latent heat when the water evaporates, whereby the water 54 can be cooled down less than that in the ambience. Hence, the water vaporization type cooling apparatus can be operated in the condition of the temperature being above the maximum working temperature of the electronic equipment, that means, no ambient limitation of the usage exists.

Since the selective water vapor permeable membrane 53 composing a part of the container 52 does not allow the permeation of the water, there is no risk of leaking water outside when the water 54 is supplied in the heat sink 51. Therefore, a plurality of the heat sinks 51 can be mounted on the board 50a without any risk of the short circuit caused by the water leakage, so that the safe and compact cooling can be effected.

In addition, since the air and the water are utilized as the cooling coolant, the recovery of the coolant is not required for the environmental protection as in the case of utilizing the halogenated solvent such as flon or perfluorocarbons. As a result, the cooling apparatus free of the problem on the environmental protection can be obtained.

As the cooling mechanism is based on the evaporation latent heat of the water, high cooling efficiency can be achieved by the small amount of the coolant to be circulated. In addition, since the air circulated acts only as the transporting medium for transporting the evaporated water, the air volume to be circulated is extremely small. Hence, no larger air circulator or larger passage for the aeration is required, so that the arrangement of the cooling apparatus required from the cooling point of view can be miniaturized.

Second Embodiment

In the first embodiment described above, the water evaporated in the heat sink 51 is charged with the water stored in the water supply tank 56 through the conduits 57a and 57b which interconnect the heat sink 51 and the water supply tank 56. In the second embodiment, on the recognition that the dehydrated air is humidified by absorbing the water vapor through the process that the dehydrated air flows on the outer surface of the heat sink 51, the water is designed to be recovered for reuse from the humidified air by absorbing the water vapor through the process that the dehydrated air flows on the outer surface of the heat sink 51 so that the dehydrated air can be obtained simultaneously.

Figure 6:
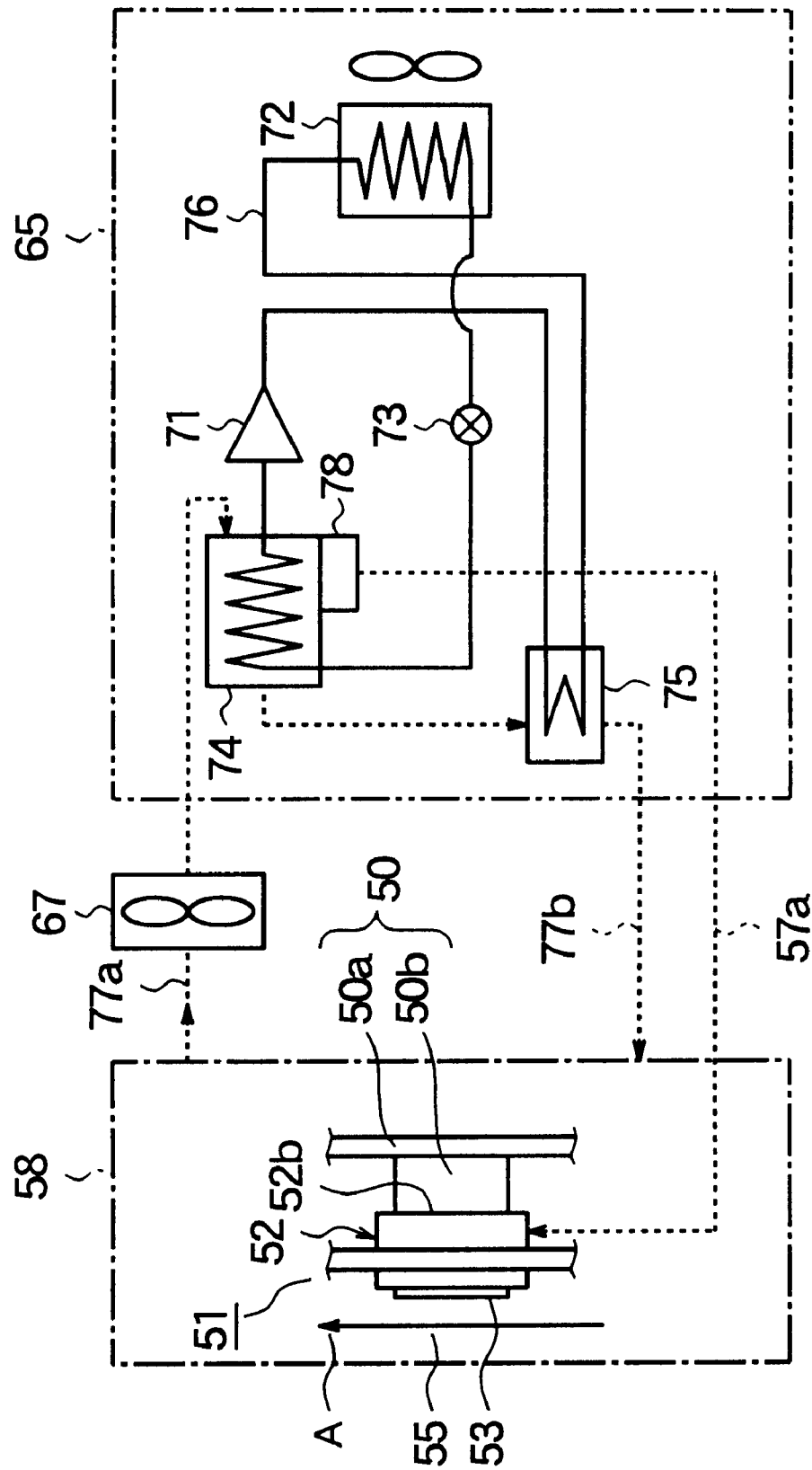
FIG. 6 is a system diagram of the water vaporization type cooling apparatus according to a second embodiment of the present invention for the heat-generating unit.

FIG. 6 shows a system arrangement of a water vaporization type cooling apparatus according to the second embodiment of the present invention for the heat-generating unit.

In FIG. 6, a dehumidifying device 65 is composed of a coolant compressor 71, a coolant condenser 72, an expansion valve 73, a coolant evaporator 74, an air heater 75, and a coolant conduit 76 connecting these units mentioned above to form a closed loop. The circulating air circulated by an air circulator 67 is designed to flow in a secondary side of the coolant evaporator 74 and the air heater 75.

The coolant is circulated in the closed loop. The coolant in the coolant evaporator 74 is compressed in the coolant compressor 71 and afterwards is fed to the coolant condenser 72 through the air heater 75. The compressed coolant is condensed in the coolant condenser 72 to radiate the heat outside the system, and then is adiabatically expanded freely in the expansion valve 73. The coolant expanded adiabatically is fed in the coolant evaporator 74, so that the air circulating in the secondary side is cooled down below the dew point thereof by the endothermic cooling effect of the coolant developed through the process of the adiabatic expansion thereof.

There is provided a water pit 78 as a water reservoir at the bottom of the coolant evaporator 74. When the air flowing in the secondary side is cooled down, the condensed water evolved at the condensation of the moisture contained in the air is stored in the water pit 78.

The heat-generating unit 50 in the state of being thermally connected to the heat sink 51 is received in the closed space 58. The closed space 58 and the dehumidifying device 65 are interconnected through air conduits 77a and 77b so as to form the closed circuit of the air circulation as a gas circulation passage. An air circulator 67 as a gas circulating means such as a fan is disposed in the course of the air conduit 77a. By the operation of the air circulator 67, the air in the closed space 58 is fed into the dehumidifying device 65 through the air conduit 77a, so that the air becomes the dehydrated air through separation and condensation of the water vapor contained in the air. The resulting dehydrated air is returned to the closed space 58 through the air conduit 77b and is forced to flow in the closed circuit along the selective water vapor permeable membrane 53 as shown by the arrow A in FIG. 6.

The water pit 78 in the dehumidifying device 65 and the heat sink 51 are interconnected through a conduit 57a as a mean for returning water so that the water separated and recovered in the dehumidifying device 65 is returned to the heat sink 51.

Next, the cooling operation of the water vaporization type cooling apparatus according to the second embodiment will be explained.

Upon actuation of the air circulator 67 the air in the closed space 58 is fed in the dehumidifying device 65 through the air conduit 77a to flow through the secondary side of the circulating coolant evaporator 74 and the air heater 75, and then is fed in the closed space 58 through the air conduit 77b. When flowing through the secondary side of the circulating coolant evaporator 74, the air is cooled down below the dew point thereof. During the cooling the moisture contained in the air is condensed and stored as the condensed water in the water pit 78. When the air cooled down below the dew point thereof flows through the secondary side of the air heater 75, the air is heated up to the room temperature and fed as the dehydrated air in the closed space 58 through the air conduit 77b.

The dehydrated air 55 fed in the closed space 58 flows along the outer surface of the selective water vapor permeable membrane 53 as shown by the arrow A in FIG. 6. The water vapor in the heat sink 51 are drawn into the closed space 58 through the selective water vapor permeable membrane 53, so that the air flowing in the closed space 58 is moistened by the water vapor and then is fed in the dehumidifying device 65 through the air conduit 77a.

In the meantime, heat generated by the CPU 50b is transferred to the heat sink 51 through the wall 52b of the container 52, so that the water in the container 52 is heated to evaporate. The water vapor generated as described above passes through the selective water vapor permeable membrane 53 and is absorbed in the dehydrated air 55 flowing in the closed space 58, so that the humidity in the heat sink 51 becomes to an equivalent level of the dehydrated air flowing in the closed space 58. The water vapor drawn in the closed space 58 is condensed and recovered in the dehumidifying device 65, and is stored as the condensed water in the water pit 78. Afterwards, the condensed water is returned sequentially to the heat sink 51 through the conduit 57a.

Hence, the effect obtained in the second embodiment is equivalent to that in the first embodiment described above.

According to the second embodiment, the water vapor evaporated in the heat sink 51 is absorbed in the dehydrated air 55 after passing through the selective water vapor permeable membrane 53 and is recovered as the condensed water in the dehumidifying device 65 to be fed in the heat sink 51. Consequently, no water supply from the outside of the system is required, that is, the cooling of the heat-generating unit 50 in the closed loop can be performed.

Third Embodiment

Figure 7:
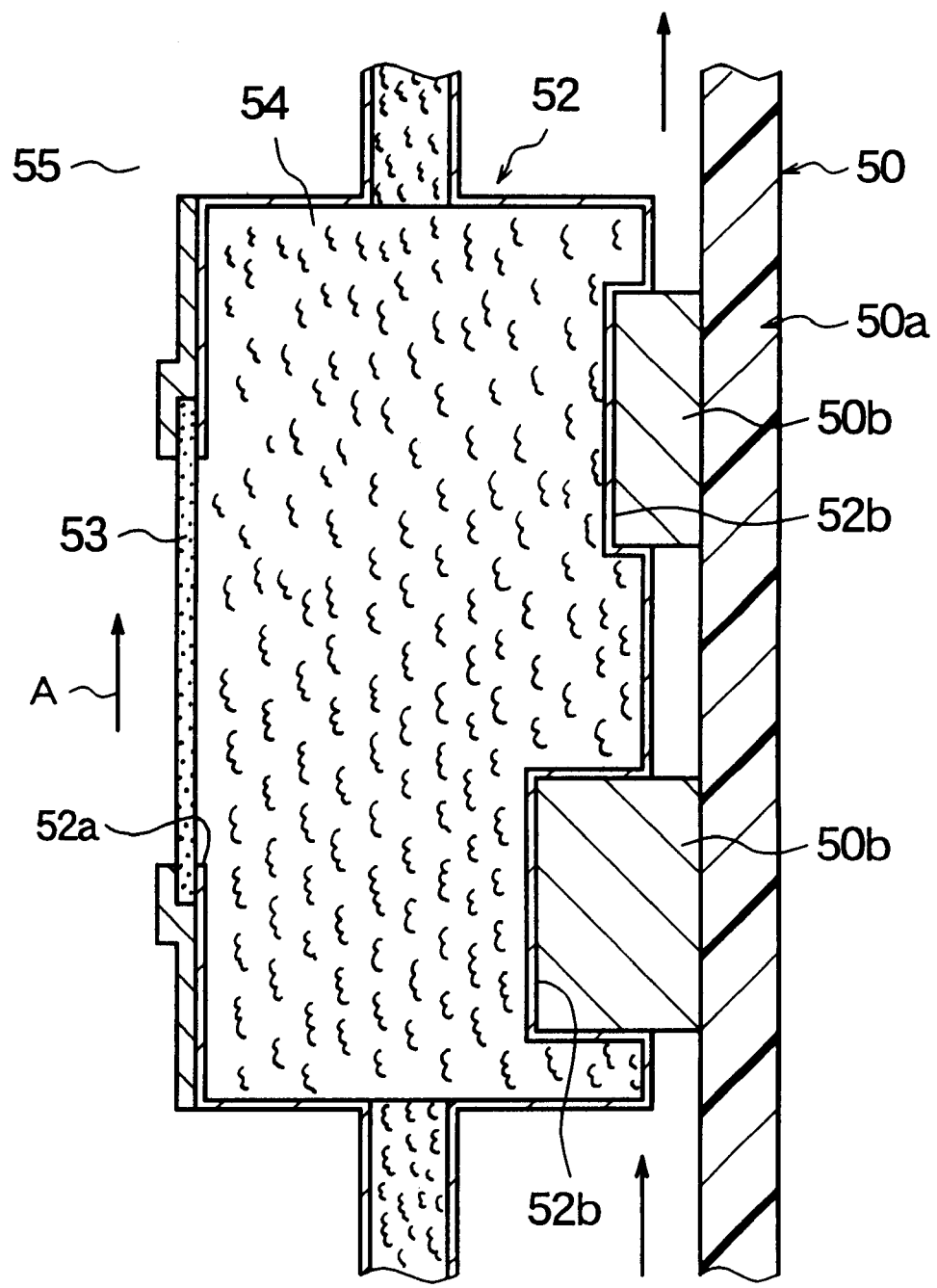
FIG. 7 is a sectional view of a major portion of the water vaporization type cooling apparatus according to a third embodiment of the present invention for the heat-generating unit.
Figure 8:
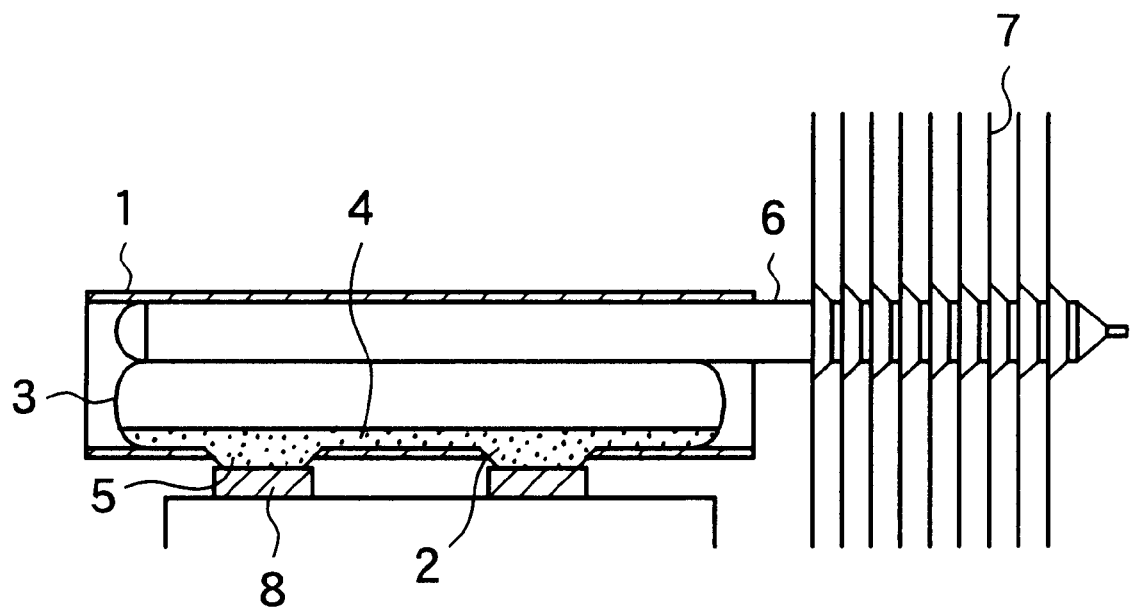
FIG. 8 shows an arrangement of a conventional heat transfer apparatus.

In the third embodiment, a shape of an outer surface 52b of the container 52 is formed in conformity with the surface to be cooled of the heat-generating unit 50 as shown in FIG. 7.

Accordingly, the outer surface 52b of the container 52 can be disposed in a close contact with the surface to be cooled of the heat-generating unit 50, so that the thermal resistance at the interface between the container 52 and the heat-generating unit 50 can be markedly reduced, i.e., the heat-generating unit 50 can be effectively cooled down.

Fourth Embodiment

In the third embodiment described above, the shape of the outer surface 52b of the container 52 is formed in conformity with the surface to be cooled of the heat-generating unit 50. While in the fourth embodiment, an equivalent effect to the third embodiment can be obtained when the container 52 is made of a flexible material. The flexible material composing the container 52 is such as a film laminated a good thermal conductive plastic and a metal film, or an embossed metal film.

In each embodiment described heretofore, the heat-generating unit 50 to be cooled is explained by use of the CPU 50b mounted on the board 50a. However, it is appreciated that the present invention is not limited to the above application and can be applied to, for example, a power electric semiconductor, a thyristor, and a laser related apparatus. More particularly, the present invention can be effectively applied to the cooling for a device associated with large thermal flux of radiation.

In order to achieve the above object, according to one aspect of the present invention, there is provided a water vaporization type cooling apparatus for cooling a heat-generating unit, comprising a container which is made of a good thermal conductive material and has an opening; a selective water vapor permeable membrane which is mounted to the container so as to cover the opening and forms a closed space cooperatively with the container; and water charged in the closed space. In the water evaporative cooling device, the container is thermally connected to the heat-generating unit and dehydrated air flows along the outer surface of the selective water vapor permeable membrane, whereby the heat-generating unit is cooled down. Hence, the cooling apparatus described above can be cooled down below an ambient temperature, i.e., the usage can not be restricted by the ambient condition, and is suitable for the environment protection.

The cooling apparatus may have a dehumidifying device which separates/recovers water vapor contained in air by condensation thereof in a water reservoir and obtains the air with low humidity, an air circulation circuit which circulates the air with low humidity obtained in the dehumidifying device along the outer surface of the selective water vapor permeable membrane and then returns the air to the dehumidifying device, and water return means for returning the water recovered in the water reservoir of the dehumidifying device to the closed space. Accordingly, no water supply from the outside of the system is required and the heat-generating unit can be cooled down in the closed loop.

An outer surface of a part of the container to be thermally connected to the heat-generating unit may be formed in conformity with a surface to be cooled of the heat-generating unit, so that the thermal resistance at the interface between the container and the heat-generating unit can be reduced to be able to perform the highly efficient cooling.

The container may be made of a flexible material, so that, similar to the effect mentioned above, the thermal resistance at the interface between the container and the heat-generating unit can be reduced to be able to perform the highly efficient cooling.

What is claimed is:

1. A water vaporization type cooling apparatus for cooling a heat-generating unit, comprising:
   a container which is made of a thermal conductive material and has an opening;
   a selective water vapor permeable membrane which is mounted to said container so as to cover the opening and forms a closed space cooperatively with said container; and water filled in the closed space;

wherein said container is thermally connected to the heat-generating unit; and wherein dehydrated air flows along the outer surface of said selective water vapor permeable membrane, whereby the heat-generating unit is cooled down.

2. A water vaporization type cooling apparatus according to claim 1, further comprising:

a dehumidifying device which separates/recovers water vapor contained in air by condensation thereof in a water reservoir and obtains the air with low humidity;

an air circulation circuit which circulates the air with low humidity obtained in the dehumidifying device along the outer surface of said selective water vapor permeable membrane and subsequently returns the air to the dehumidifying device; and water return means for returning the water recovered in the water reservoir of the dehumidifying device to the closed space.

3. A water vaporization type cooling apparatus according to claim 1, wherein an outer surface of a part of said container to be thermally connected to the heat-generating unit is formed in conformity with a surface to be cooled of the heat-generating unit.

4. A water vaporization type cooling apparatus according to claim 1, wherein said container is made of a flexible material.

* * * * *

UNITED STATES PATENT AND TRADEMARK OFFICE
CERTIFICATE OF CORRECTION

PATENT NO.    : 6,282,913 B1
DATED         : September 4, 2001
INVENTOR(S)   : Tetsuo Moriguchi and Kazuhiko Hara It is certified that error appears in the above-identified patent and that said Letters Patent is hereby corrected as shown below:

<u>Title page,</u>
Under "FOREIGN PATENT DOCUMENTS", please add
-- 11-94475    4/1999  (JP) ................F28D  5/00, 21/00 --

Signed and Sealed this

Ninth Day of April, 2002

Attest:

Attesting Officer

JAMES E. ROGAN
Director of the United States Patent and Trademark Office